United States Patent
Martynovich et al.

(10) Patent No.: US 9,654,058 B2
(45) Date of Patent: May 16, 2017

(54) APPARATUS AND METHOD FOR DIGITAL PRE-DISTORTION IN WIRELESS COMMUNICATION SYSTEM

(71) Applicant: Samsung Electronics Co., Ltd, Gyeonggi-do (KR)

(72) Inventors: Pavel Martynovich, Gyeonggi-do (KR); Jae-Bum Kim, Seoul (KR); Young-Yoon Woo, Gyeonggi-do (KR); Mun-Woo Lee, Gyeonggi-do (KR)

(73) Assignee: SAMSUNG ELECTRONICS CO., LTD, Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/783,805

(22) PCT Filed: Apr. 1, 2014

(86) PCT No.: PCT/KR2014/002786
§ 371 (c)(1),
(2) Date: Oct. 9, 2015

(87) PCT Pub. No.: WO2014/168369
PCT Pub. Date: Oct. 16, 2014

(65) Prior Publication Data
US 2016/0079932 A1  Mar. 17, 2016

(30) Foreign Application Priority Data
Apr. 10, 2013 (KR) .................. 10-2013-0039208

(51) Int. Cl.
*H03F 1/32* (2006.01)
*H03F 3/189* (2006.01)
(Continued)

(52) U.S. Cl.
CPC ........... *H03F 1/3247* (2013.01); *H03F 3/189* (2013.01); *H03F 3/245* (2013.01);
(Continued)

(58) Field of Classification Search
CPC ............. H03F 1/3247; H03F 2200/435; H03F 2200/451; H03F 2201/3231; H03F 3/189;
(Continued)

(56) References Cited

U.S. PATENT DOCUMENTS 8,229,025 B1  7/2012 Summerfield
8,243,852 B1  8/2012 Summerfield
(Continued)

FOREIGN PATENT DOCUMENTS

KR  10-2006-00387393  5/2006

OTHER PUBLICATIONS

International Search Report dated Jun. 27, 2014 in connection with International Patent Application No. PCT/KR2014/002786, 4 pages.

*Primary Examiner* — Sophia Vlahos

(57) ABSTRACT

Provided is a Digital Pre-Distortion (DPD) apparatus and method for processing a signal that is input to a power amplifier in a wireless communication system. The DPD apparatus includes a DPD unit configured to pre-distort an input signal that is input to the power amplifier, using DPD information; and a signal processor configured to capture signals for estimation of the DPD information from each of an input terminal and an output terminal of the power amplifier, detect peak signals of the captured signals, separate the detected peak signals into a plurality of intervals depending on a power level, separately store the detected peak signals, estimate the DPD information using the peak signals stored for each interval, and provide the estimated DPD information to the DPD unit.

18 Claims, 7 Drawing Sheets

(51) Int. Cl.
*H03F 3/24* (2006.01)
*H04B 1/04* (2006.01)

(52) U.S. Cl.
CPC .. *H03F 2200/435* (2013.01); *H03F 2200/451* (2013.01); *H03F 2201/3227* (2013.01); *H04B 1/0475* (2013.01); *H04B 2001/0425* (2013.01)

(58) Field of Classification Search
CPC ... H03F 3/19; H03F 3/21; H03F 3/245; H03F 2200/105; H03F 2201/3227; H04L 27/368; H04B 1/0475; H04B 2001/0425; H04B 2201/70706; H03G 3/3042
See application file for complete search history.

(56) References Cited

U.S. PATENT DOCUMENTS

| | | |
|---|---|---|
| 8,285,770 B1 | 10/2012 | Barnes et al. |
| 2003/0117215 A1 | 6/2003 | O'Flaherty et al. |
| 2008/0157819 A1* | 7/2008 | Bhandari .......... H04L 25/03343 327/33 |
| 2008/0157869 A1* | 7/2008 | Bhandari .............. H03F 1/3247 330/149 |
| 2008/0157870 A1* | 7/2008 | Bhandari .............. H03F 1/3247 330/149 |
| 2008/0265996 A1 | 10/2008 | Kim et al. |
| 2011/0136452 A1 | 6/2011 | Pratt et al. |
| 2011/0221527 A1 | 9/2011 | Woo et al. |
| 2012/0133434 A1* | 5/2012 | Woo ..................... H03F 1/3247 330/149 |

* cited by examiner

APPARATUS AND METHOD FOR DIGITAL PRE-DISTORTION IN WIRELESS COMMUNICATION SYSTEM

CROSS-REFERENCE TO RELATED APPLICATION(S)

The present application claims priority under 35 U.S.C. §365 to International Patent Application No. PCT/KR2014/002786 filed Apr. 1, 2014, entitled "APPARATUS AND METHOD FOR DIGITAL PRE-DISTORTION IN WIRELESS COMMUNICATION SYSTEM", and, through International Patent Application No. PCT/KR2014/002786, to Korean Patent Application No. 10-2013-0039208 filed Apr. 10, 2013, each of which are incorporated herein by reference into the present disclosure as if fully set forth herein.

TECHNICAL FIELD

The present disclosure relates generally to a Digital Pre-Distortion (DPD) apparatus and method in a wireless communication system, and more particularly, to a DPD apparatus and method capable of stably performing DPD in a wireless communication system.

BACKGROUND ART

In a wireless communication system, a Power Amplifier (PA) used for a Radio Frequency (RF) stage requires linear characteristics. In the PA, the linear characteristics may provide not only a signal level allowable in an adjacent channel, but also a small Error Vector Magnitude (EVM). The signal level allowable in an adjacent channel may represent, for example, an Adjacent Channel Leakage Ratio (ACLR). The ACLR means a difference between power of the center channel and power of an adjacent channel which is apart from the center channel by a specific offset frequency, and the ACLR is an index indicating linearity of the PA.

Every time the PA operates with a high efficiency, it linear characteristics may rapidly change to nonlinear characteristics, causing distortion of output signals. A DPD algorithm is used to compensate for the distortion of output signals.

Reference will be made to FIGS. 1A to 1C to describe the concept of the common DPD algorithm.

FIG. 1A illustrates ideal linear characteristics 101 between an input and an output of a PA. In FIG. 1A, an input of the PA may be almost the same as an output thereof, or may be different from the output by a scaling factor K. FIG. 1B illustrates nonlinear distortion 103 in an actual operation of a PA. In FIG. 1B, an output of a PA may be represented as a function F related to an input thereof.

The nonlinear distortion 103 as shown in FIG. 1B may degrade the quality of in-band signals, and cause significant out-of-band distortion. In order to compensate for the nonlinear distortion, the DPD algorithm may pre-distort a signal to be input to a PA so that an output of the PA may be linear. FIG. 1C illustrates an example of distortion 105 that is opposite to the nonlinear distortion 103 in FIG. 1B and is applied to an input signal.

FIG. 2 illustrates an example of an apparatus in which a DPD unit is coupled to an input of a PA.

In FIG. 2, a DPD unit 210 may apply distortion 201 that is opposite to nonlinear distortion 203, to an input signal at a front stage of a PA 230. Then, the nonlinear distortion 203 occurring in the PA 230 may be compensated (or removed) for by the opposite distortion 201, so a signal having linear characteristics 205 may be output at the PA 230. The opposite distortion 201 will be referred to herein as pre-distortion.

The common DPD algorithm, as described above, may easily compensate for signal distortion, for the signal whose signal level slowly changes. However, it is well known to those skilled in the art that for the signal whose signal level rapidly changes, the common DPD algorithm may not stably compensate for the signal distortion. The 'signal level' refers to a power level of the signal.

Generally, DPD parameters (also known as DPD information) for performing the pre-distortion according to the DPD algorithm may be used in the DPD unit 210 in FIG. 2. The DPD parameters may be estimated using captured signals. A plurality of signals which are captured from both of an input terminal and an output terminal of a PA may be used as the captured signals. Therefore, DPD performance may depend on the captured signals.

If a level of the captured signals is very low, the DPD unit 210 may not estimate DPD parameters for pre-distortion, with respect to magnitudes of signals in the full range.

Reference will now be made to FIGS. 3 and 4, to describe DPD characteristics that estimation of DPD parameters is limited by the maximum magnitude of a signal in a DPD algorithm.

Referring to FIG. 3, if the maximum magnitude of a captured signal is represented by reference numeral 301, the region may be divided, on the basis of the maximum magnitude 301 of the captured signal, into a region 303 where the DPD parameters can be estimated and a region 305 where the DPD parameters are unknown or cannot be estimated. The maximum magnitude of the captured signal means the maximum power level of the signal. In the DPD algorithm, DPD parameters estimated for any signal level (or signal magnitude) may be applied to a signal that has a power level lower than (or similar to) the signal level, but may not be applied to a signal that has a power level higher than the signal level.

Referring to FIG. 4, the x-axis represents a time, the y-axis represents a signal magnitude, and DPD parameters are assumed to be estimated from a signal that is captured in, for example, a part "3" 401 in the time axis. In this case, the DPD algorithm may successfully estimate DPD parameters in parts "2", "4", "5" and "6" having a signal level lower than or equal to the signal level of the part "3" 401. However, in parts "1" 403 and "7" 405 having a signal level higher than the signal level of the part "3" 401, the DPD algorithm may not estimate DPD parameters due to the DPD characteristics that estimation of DPD parameters is limited by the maximum magnitude of a signal.

A variety of DPD algorithms have been proposed, which can stably estimate DPD parameters even when the signal level changes abruptly in a DPD process as in the example of FIG. 4.

As regards an example of a DPD apparatus based on the existing DPD algorithm, the DPD apparatus may capture input/output signals at each of an input terminal and an output terminal of a PA. As for the captured signals, small parts of the original signal may be captured, and the DPD apparatus may perform validation determination for determining whether DPD parameters extracted from the captured signals are valid. The validation determination may be performed by comparing characteristics (hereinafter referred to as 'long-term characteristics') of signals captured for a long term with characteristics (hereinafter referred to as 'short-term characteristics') of signals captured for a short term. As for the long term and the short term, if a capture time for signals is longer than or equal to a predetermined time, the capture time may be defined as the long term, and if the capture time is shorter than or equal to a predetermined time, the capture time may be defined as the short term. The validation determination may be performed based on the signal level (e.g., signal power), Probability Density Function (PDF) and the like. The DPD apparatus may perform pre-distortion on the signals input to the PA, by estimating DPD parameters (or by performing DPD parameter estimation) from the signals that have passed the validation determination, among the captured signals.

FIG. 5 illustrates an example of capturing signals in a DPD apparatus based on the existing DPD algorithm, in which it is assumed that signals for estimation of DPD parameters are captured in a long-term measurement period 510. Signals captured in the example of FIG. 5 may be separated into signals 501 and 505 having a higher signal level and signals 503 having a lower signal level, depending on their signal levels. If the limitation by the maximum magnitude of a signal, which has been described in conjunction with FIGS. 3 and 4, is considered, the DPD apparatus in the example of FIG. 5 may determine the captured signals 501 having a higher signal level in each long-term measurement period 510 as signals valid for DPD parameter estimation, and determine the captured signals 503 having a lower signal level as signals invalid for DPD parameter estimation. Therefore, the DPD apparatus may estimate DPD parameters using only the captured signals 501 having a higher signal level in each long-term measurement period 510.

However, if DPD parameters are estimated in the long-term estimation period as in the example of FIG. 5, the DPD parameters may not be properly updated, in the case where an interval having a lower signal level is long in the long-term measurement period as shown by reference numeral 503.

FIG. 6 illustrates another example of capturing signals in a DPD apparatus based on the existing DPD algorithm, in which it is assumed that signals for estimation of DPD parameters are captured in long-term measurement periods 610a and 610b which are shorter than the long-term measurement period 510 in FIG. 5. Signals captured in the example of FIG. 6 may be separated into signals 611, 613 and 617 having a lower signal level and signals 615 having a higher signal level, depending on their signal levels. In the example of FIG. 6, DPD parameter update may be performed even in the long-term measurement period 610b, ensuring a more stable DPD operation compared with that in the example of FIG. 5.

However, in the example of FIG. 6, if there are signals having a high signal level as shown by reference numeral 619 in the next burst after the long-term measurement period 610b, a stable DPD operation may not be performed due to the limitation by the maximum magnitude of a signal.

Therefore, if a signal level of captured signals rapidly changes, the DPD apparatus based on the existing DPD algorithm may not guarantee a stable DPD operation. In consideration of these and other problems, a DPD algorithm has been proposed, which stores a plurality of sets of signal level-specific DPD parameters as table information, and performs a DPD operation by switching a set of DPD parameters to correspond to the signal level.

However, the DPD algorithm that uses a plurality of sets of DPD parameters should frequently switch the set of DPD parameters depending on the signal level, and the frequency switching may cause nonlinear distortion which is undesirable in a DPD operation. In addition, since this DPD algorithm requires a plurality of sets of DPD parameters, its DPD apparatus may be higher in complexity than a DPD apparatus based on a DPD algorithm that uses a single set of DPD parameter.

The above information is presented as background information only to assist with an understanding of the present disclosure. No determination has been made, and no assertion is made, as to whether any of the above might be applicable as prior art with regard to the present disclosure.

DISCLOSURE OF INVENTION

Technical Problem

An aspect of the present disclosure is to address at least the above-mentioned problems and/or disadvantages and to provide at least the advantages described below. Accordingly, an aspect of the present disclosure is to provide a Digital Pre-Distortion (DPD) apparatus and method capable of stably performing DPD in response to changes in signal level in a wireless communication system.

Another aspect of the present disclosure is to provide a DPD apparatus and method capable of stably performing DPD in response to changes in signal level and of reducing the complexity in a wireless communication system.

Solution to Problem

In accordance with an aspect of the present disclosure, there is provided a Digital Pre-Distortion (DPD) apparatus for processing a signal that is input to a power amplifier in a wireless communication system. The DPD apparatus includes a DPD unit configured to pre-distort an input signal that is input to the power amplifier, using DPD information; and a signal processor configured to capture signals for estimation of the DPD information from each of an input terminal and an output terminal of the power amplifier, detect peak signals of the captured signals, separate the detected peak signals into a plurality of intervals depending on a power level, separately store the detected peak signals, estimate the DPD information using the peak signals stored for each interval, and provide the estimated DPD information to the DPD unit.

In accordance with another aspect of the present disclosure, there is provided a Digital Pre-Distortion (DPD) method for processing a signal that is input to a power amplifier in a wireless communication system. The DPD method includes capturing signals for estimation of the DPD information from each of an input terminal and an output terminal of the power amplifier; detecting peak signals of the captured signals; separating the detected peak signals into a plurality of intervals depending on a power level, and separately storing the detected peak signals; estimating the DPD information using the peak signals stored for each interval; and pre-distorting an input signal that is input to the power amplifier, using the estimated DPD information.

Other aspects, advantages, and salient features of the disclosure will become apparent to those skilled in the art from the following detailed description, which, taken in conjunction with the annexed drawings, discloses exemplary embodiments of the disclosure.

BRIEF DESCRIPTION OF DRAWINGS

The above and other aspects, features and advantages of certain exemplary embodiments of the present disclosure will be more apparent from the following description taken in conjunction with the accompanying drawings, in which.

Throughout the drawings, like reference numerals will be understood to refer to like parts, components, and structures.

MODE FOR THE INVENTION

The following description with reference to the accompanying drawings is provided to assist in a comprehensive understanding of exemplary embodiments of the disclosure as defined by the claims and their equivalents. It includes various specific details to assist in that understanding but these are to be regarded as merely exemplary. Accordingly, those of ordinary skilled in the art will recognize that various changes and modifications of the embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of exemplary embodiments of the present disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Figure 7:
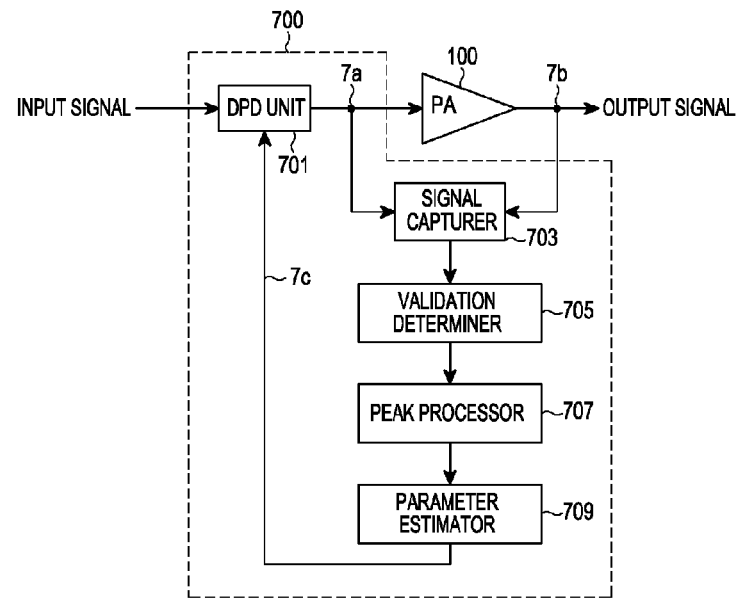
FIG. 7 illustrates a structure of a DPD apparatus in a wireless communication system according to an embodiment of the present disclosure.

FIG. 7 illustrates a structure of a DPD apparatus in a wireless communication system according to an embodiment of the present disclosure.

Figure 1A:
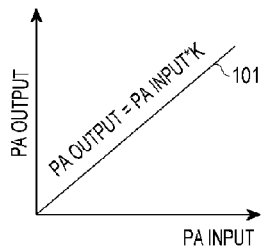
FIGS. 1A to 1C illustrate the schematic concept of a common DPD algorithm.
Figure 1B:
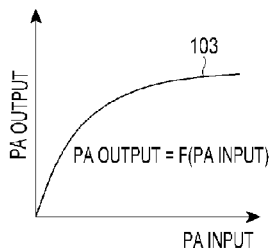
Figure 1C:
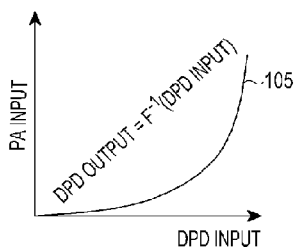
Figure 2:
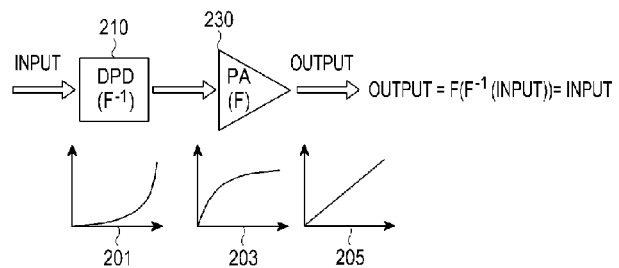
FIG. 2 illustrates an example of an apparatus in which a DPD unit is coupled to an input of a PA.
Figure 3:
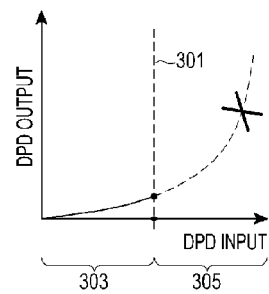
FIGS. 3 and 4 illustrate DPD characteristics that estimation of DPD parameters is limited by the maximum magnitude of a signal in a DPD algorithm.
Figure 4:
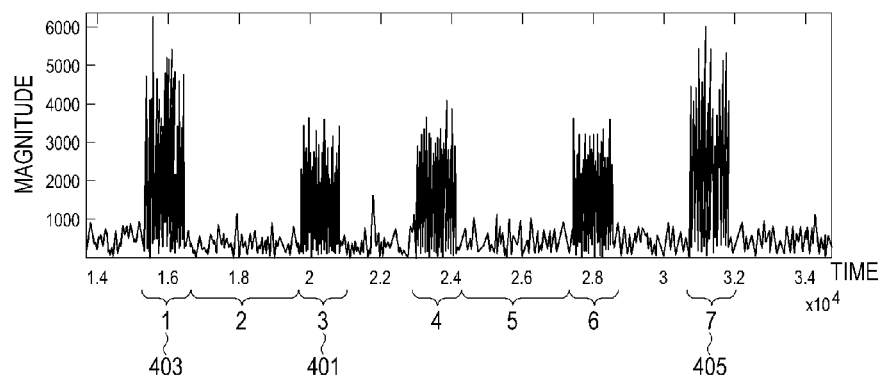
Figure 5:
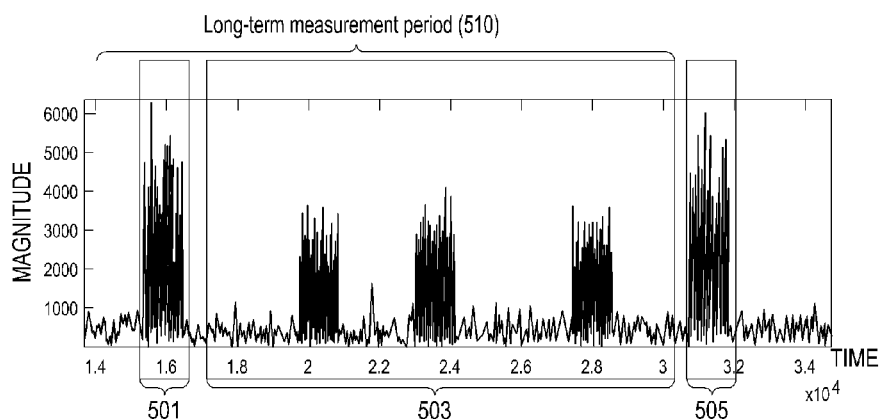
FIG. 5 illustrates an example of capturing signals in a DPD apparatus based on the existing DPD algorithm.
Figure 6:
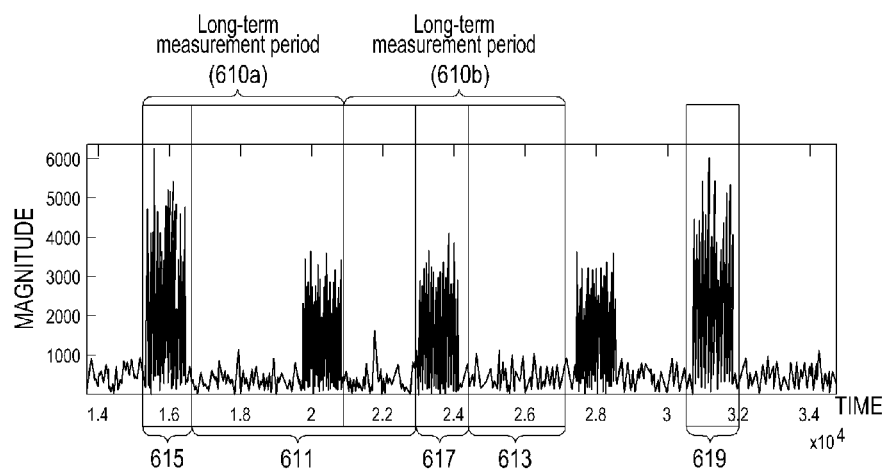
FIG. 6 illustrates another example of capturing signals in a DPD apparatus based on the existing DPD algorithm.

Referring to FIG. 7, a DPD apparatus according to an embodiment of the present disclosure may include a signal capturer 703 for capturing signals for DPD parameter estimation at each of an input terminal 7a and an output terminal 7b of a Power Amplifier (PA) 100, and a validation determiner 705 for determining whether the captured signals are signals valid for DPD parameter estimation. The DPD apparatus may also include a peak processor 707, in accordance with an embodiment of the present disclosure, for detecting peaks of the signals which are determined as valid signals among the captured signals, separating the detected peaks into a plurality of intervals depending on their power level, and storing the peak signals separated depending on the lower level, for each interval. The validation determiner 705 may determine whether the captured signals are valid, using at least one of the signal quality of the captured signals and the signal level limit described in conjunction with FIGS. 3 and 4. The determination based on the signal quality may be performed in a way of determining only the signals having the quality higher than a predetermined threshold, as valid signals.

The peak processor 707 may include at least one buffer for storing interval-specific peak signals, and the interval-specific peak signals may be updated periodically or aperiodically in the at least one buffer. The updated interval-specific peak signals may be combined in the peak processor 707, and provided to a parameter estimator 709. In FIG. 7, the peak signals, which are updated and combined for each interval, may be provided from the peak processor 707 to the parameter estimator 709 for estimating DPD parameters, and the parameter estimator 709 may estimate DPD parameters from the combined peak signals, and provide the estimated DPD parameters to a DPD unit 701. Then, the DPD unit 701 may perform pre-distortion on an input signal using the estimated DPD parameters. Although the DPD unit 701 and other components 703, 705, 707 and 709 for signal processing are assumed to be separated into a plurality of function blocks in the DPD apparatus 700 in FIG. 7, for convenience of description only, the components may be implemented as one or multiple function blocks. For example, the remaining components except for the DPD unit 701 in FIG. 7 may be implemented as a single signal processor.

Figure 8:
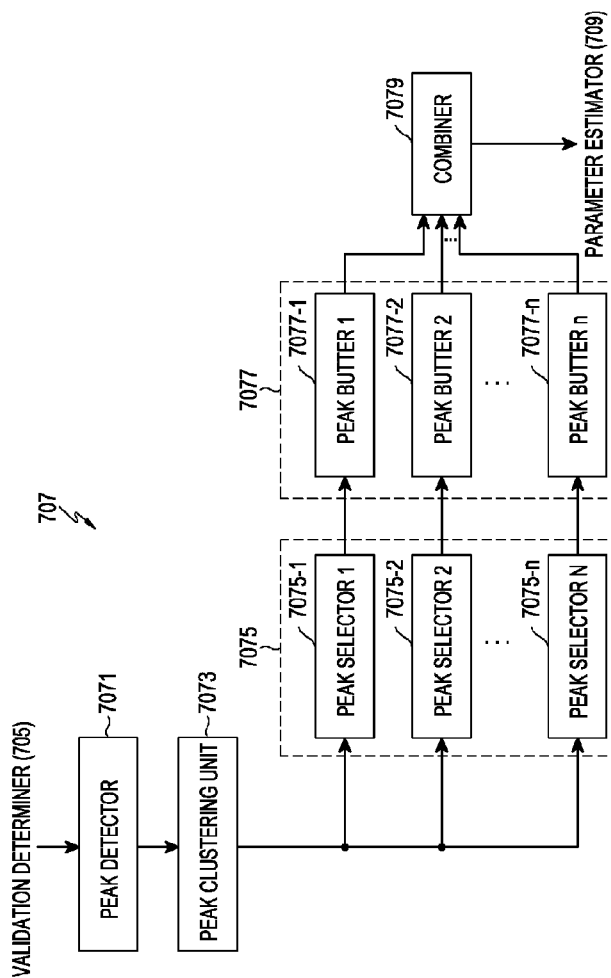
FIG. 8 illustrates a structure of the peak processor 707 in FIG. 7.

FIG. 8 illustrates a structure of the peak processor 707 in FIG. 7.

Figure 9:
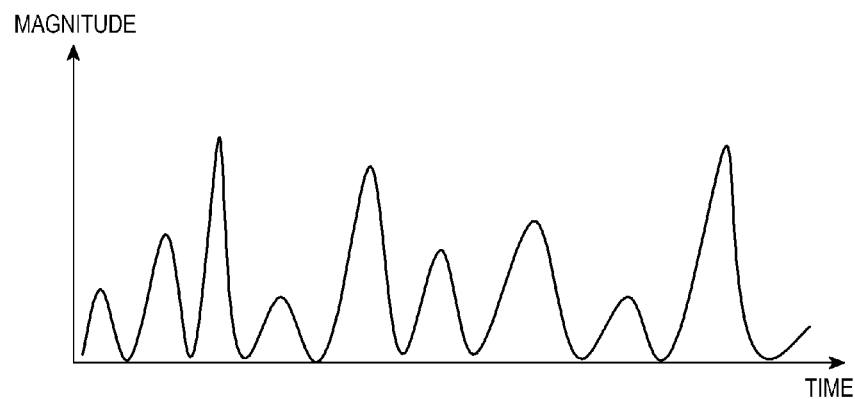
FIGS. 9 and 10 illustrate an operation of the peak detector 7071 in FIG. 8.
Figure 10:
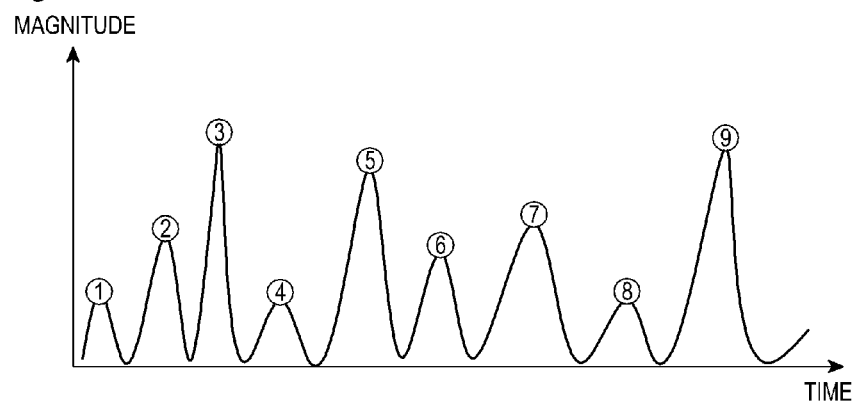
Figure 11:
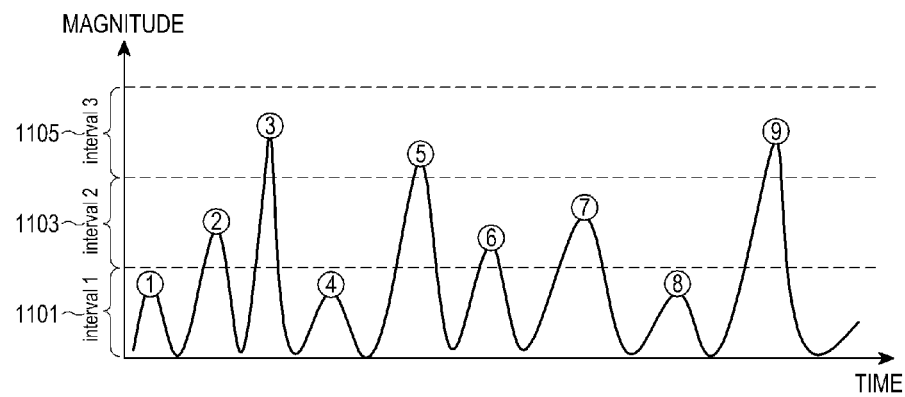
FIG. 11 illustrates an operation of the peak clustering unit 7073 in FIG. 8.

Referring to FIG. 8, the peak processor 707 may include a peak detector 7071, a peak clustering unit 7073, a peak selector 7075, a peak buffer 7077, and a combiner 7079. If signals captured to be valid are as shown in FIG. 9, the peak detector 7071 may detect all peaks ① to ⑨ of the captured signals as in an example of FIG. 10. The peak clustering unit 7073 may separate the detected peak signals into a predetermined number of intervals depending on their power level. For instance, FIG. 11 illustrates an example of separating the detected peak signals into three intervals 1101, 1103 and 1105 depending on their power level. In the illustrated example, first peak signals ①, ④ and ⑧ may belong to a first interval 1101, second peak signals ②, ⑥ and ⑦ may belong to a second interval 1103, and third peak signals ③, ⑤ and ⑨ may belong to a third interval 1105. In FIG. 8, the peak selector 7075 may include first to n-th peak selectors 7075-1 . . . , 7075-n corresponding to the predetermined number of intervals, and the peak buffer 7077 may include first to n-th peak buffers 7077-1, . . . , 7077-n corresponding to the predetermined number of intervals. In an embodiment of the present disclosure, the number of intervals into which the peak signals are separated may be set to a predetermined number, or may be variably set depending on the DPD operation status. In the below-described embodiment of the present disclosure, the number of intervals will be assumed as 3, for convenience of description. However, it should be noted that in the present disclosure, the number of intervals is not limited to 3.

Figure 12:
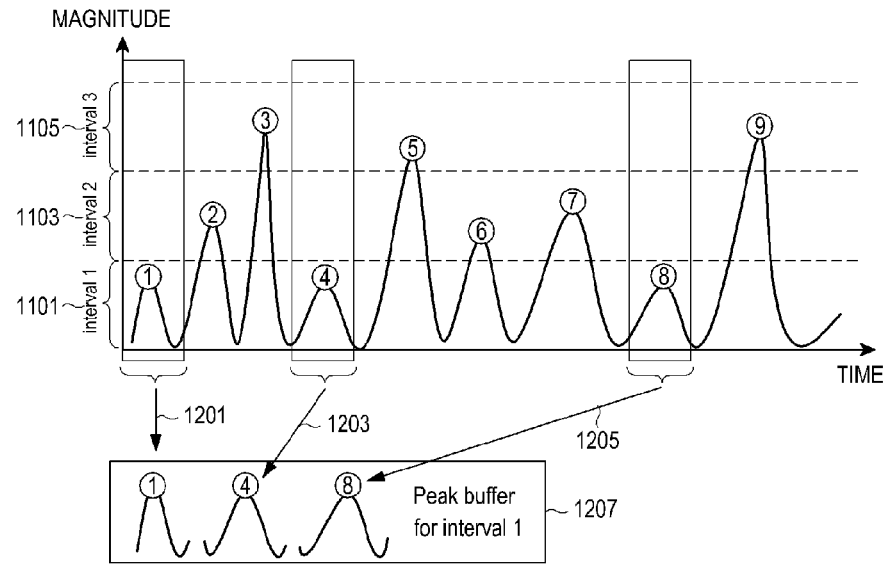
FIG. 12 illustrates operations of the peak selector 7075 and the peak buffer 7077 in FIG. 8.

For example, the first peak signals ①, ④ and ⑧ belonging to the first interval 1101 may be selected in the first peak selector 7075-1 depending on the power levels separated in the peak clustering unit 7073, and stored in the first peak buffer 7077-1. FIG. 12 schematically illustrates an example of an operation in which the first peak signals ①, ④ and ⑧ are selected as peak signals for the first interval 1101 (1201, 1203 and 1205), and stored in the first peak buffer 7077-1 (1207). Although not illustrated, the second peak signals ②, ⑥ and ⑦ belonging to the second interval 1103, and the third peak signals ③, ⑤ and ⑨ belonging to the third interval 1105 may be stored in the second peak buffer 7077-2 and a third peak buffer through the same operation, respectively.

Figure 13:
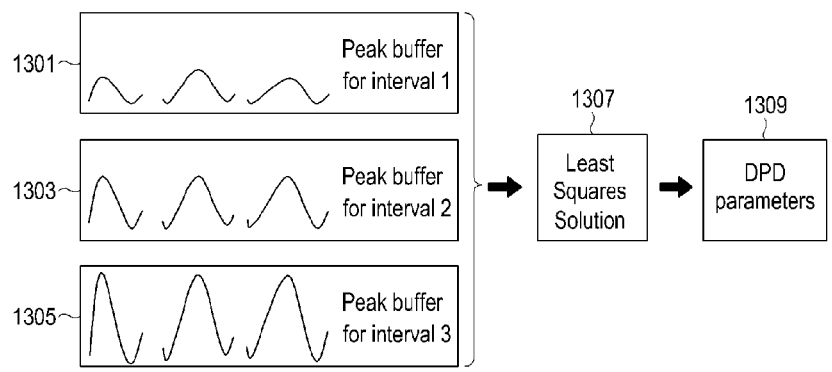
FIGS. 13 to 16 illustrate examples in which peak signals for estimation of DPD parameters are stored and combined for each interval according to an embodiment of the present disclosure.

As in an example of FIG. 13, interval-specific peak signals 1301, 1303 and 1305, which are stored in the first to third peak buffers according to the aforesaid operation, may be combined in the combiner 7079 in FIG. 8, and provided to the parameter estimator 709. The parameter estimator 709 may estimate DPD parameters 1309 using the combined signal. Based on the combined signal from the combiner 7079, the parameter estimator 709 may estimate the DPD parameters 1309 using, for example, the least square solution 1307.

Figure 14:
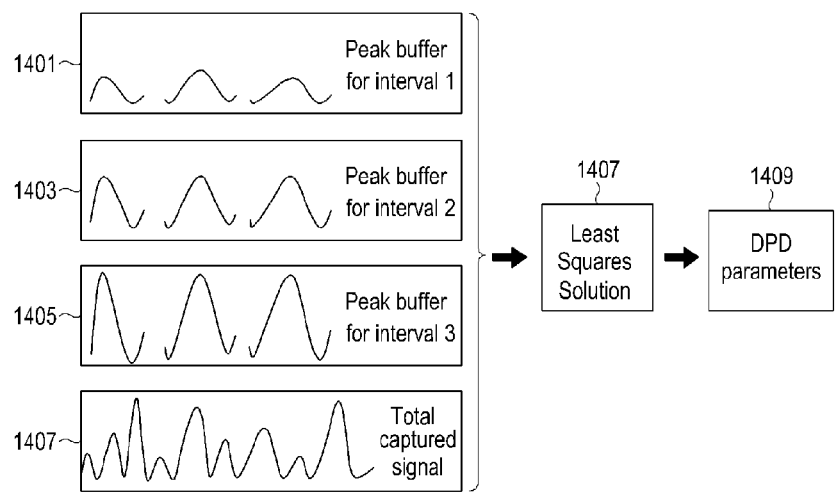

In an alternative embodiment, as in example of FIG. 14, interval-specific peak signals 1401, 1403 and 1405 stored in the first to third peak buffers, and the total captured signals 1407 output from the validation determiner 705 in FIG. 7 may be combined in the combiner 7079 in FIG. 8, and based on the combined signal, the parameter estimator 709 may estimate DPD parameters 1409 using the least square solution 1407. In the alternative embodiment, the interval-specific peak signals 1401, 1403 and 1405 stored in the first to third peak buffers may include the peak signals, which are detected from the previously captured signals.

The estimated DPD parameters are provided to the DPD unit 701, in which an input signals undergoes pre-distortion using the DPD parameters. As in the aforesaid embodiment of the present disclosure, if the DPD apparatus separates the captured signals into a plurality of intervals depending on their power level, and processes the captured signals separately, even though the captured signals rapidly change in their level, the DPD apparatus may detect peak signals of the changed level and process the detected peak signals, making it possible to stably estimate DPD parameters.

Figure 15:
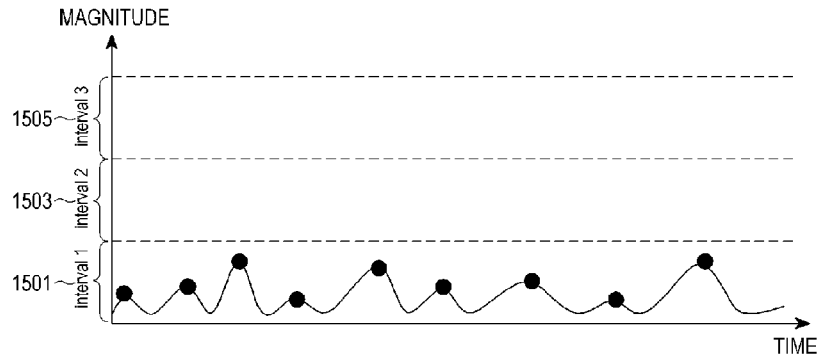
Figure 16:
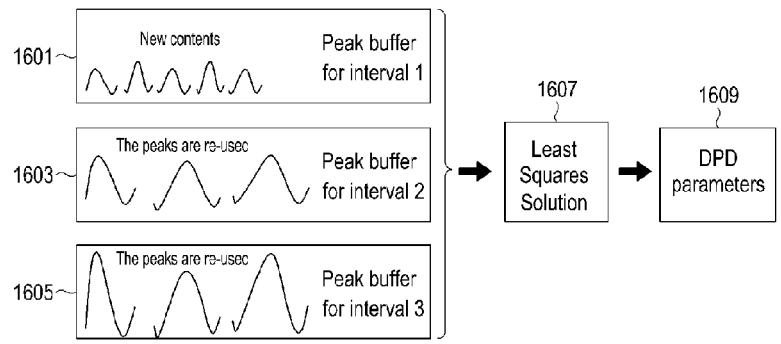

In other words, according to an embodiment of the present disclosure, the peak buffer 7077 may separately store the interval-specific peak signals depending on the power level, and the peak signals may be updated for each interval every time the captured signals are processed. For example, in a case where all the peak signals for the first to third intervals were updated at a previous time, but only the peak signals for a first interval 1501 are detected from the captured signals at the next time as in an example of FIG. 15, for the peak signals for second and third intervals 1503 and 1505, as in an example of FIG. 16, the signals (e.g., peak signals 1603 and 1605 which were detected for their associated intervals at the previous time) updated at the previous time may be equally kept and reused, and only the peak signals 1601 for the first interval 1501 may be updated. In this case, the peak signals 1601, 1603 and 1605 may be combined, and DPD parameters 1609 may be estimated in the same way using the least square solution 1607.

The DPD apparatus with the above structure may be applied to a transmitter, a repeater and the like, each of which amplifies RF signals in a wireless communication system.

Figure 17:
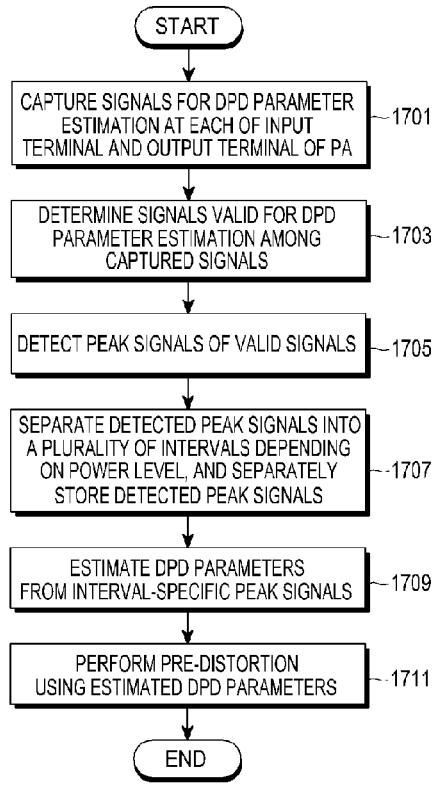
FIG. 17 is a flowchart illustrating a DPD method in a wireless communication system according to an embodiment of the present disclosure.

FIG. 17 is a flowchart illustrating a DPD method in a wireless communication system according to an embodiment of the present disclosure. The DPD method in FIG. 17 will be described with reference to FIG. 7.

Referring to FIG. 17, in operation 1701, the signal capturer 703 may capture signals for DPD parameter estimation at each of the input terminal 7a and the output terminal 7b of the PA 100. The capture operation may be periodically performed, or may be performed if update of DPD parameters is needed. In operation 1703, the validation determiner 705 may determine signals valid for DPD parameter estimation among the captured signals, based on conditions such as signal quality, level limit and the like. In operation 1705, the peak processor 707 may detect peak signals of the signals determined as valid signals among the captured signals. In operation 1707, the peak processor 707 may separate the detected peak signals into a plurality of intervals depending on the power level, and separately store the detected peak signals. Thereafter, in operation 1709, the interval-specific peak signals may be updated every time signals of the relevant level are captured, and the parameter estimator 709 and estimate DPD parameters using the combined signal of the interval-specific peak signals. Thereafter, in operation 1711, the DPD unit 701 may perform pre-distortion on an input signal using the estimated DPD parameters.

Therefore, in accordance with an embodiment of the present disclosure, even though the captured signals rapidly change in their level, the DPD apparatus may stably estimate DPD parameters, and even if a signal having a high level is not captured in a certain measurement period, the DPD apparatus may estimate DPD parameters for a signal level (or magnitude) in the full range, and may not be affected by the measurement period for DPD parameter estimation.

In addition, in accordance with an embodiment of the present disclosure, the DPD apparatus does not require a plurality of sets of DPD parameters as described above, so the DPD apparatus does not require switching of signal level-specific DPD parameter sets and even if the signal levels rapidly change, the DPD apparatus may perform a stable DPD operation, contributing to a reduction of its complexity.

Figure 18:
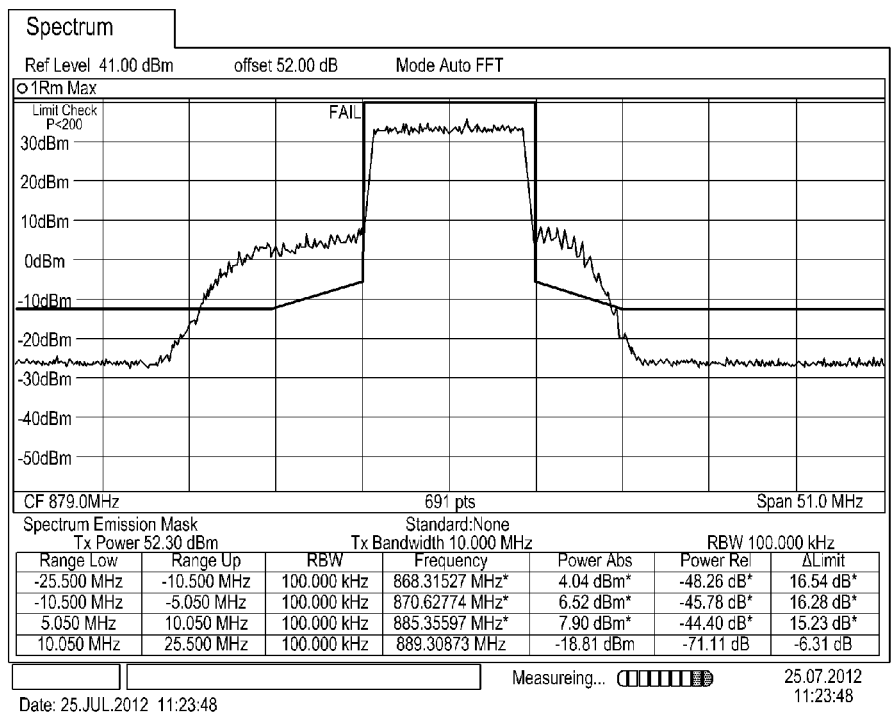
FIGS. 18 and 19 illustrate experimental results of the performance of the DPD apparatus according to an embodiment of the present disclosure.
Figure 19:
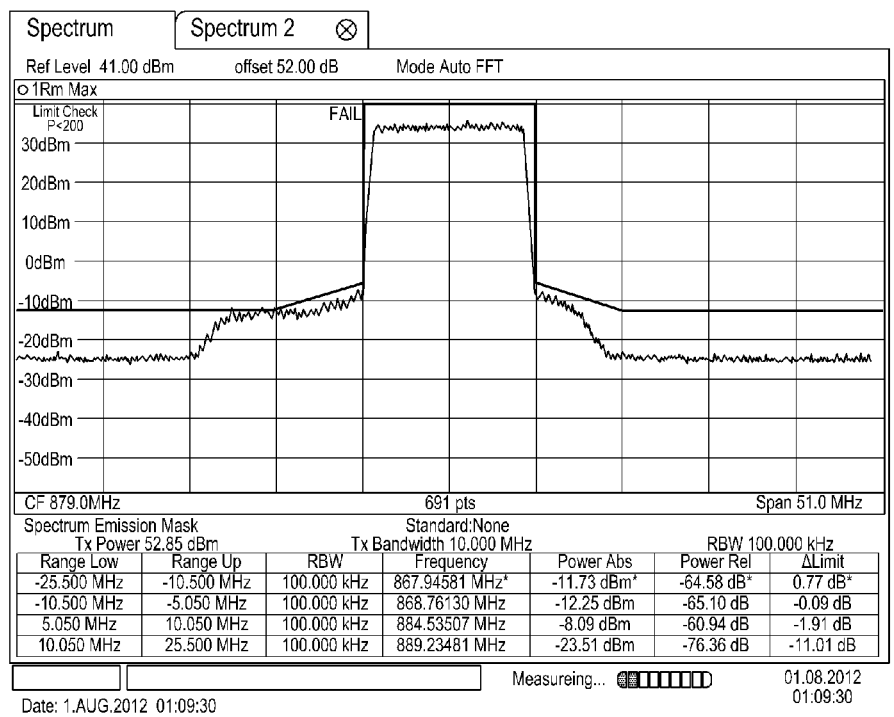

FIGS. 18 and 19 illustrate experimental results of the performance of the DPD apparatus according to an embodiment of the present disclosure, in which it is assumed that signal levels change rapidly.

Table 1 below illustrates operating conditions of the DPD apparatus according to an embodiment of the present disclosure in the performance experiments, in which it is assumed that in a Long Term Evolution (LTE) system, the number of Frequency Assignments (FAs) is one (1) and a test signal is a 10 MHz signal.

TABLE 1

| | |
|---|---|
| Operating frequency | 879 MHz |
| Test signal | 10 MHz LTE |
| Number of FAs | 1 |
| Output power | 43 dBm (3 dB back off) |

FIG. 18 illustrates the system output spectrum obtained when pre-distortion is performed through the existing DPD apparatus under the above experimental conditions. Referring to FIG. 18, it can be noted that the DPD operation may not be stably performed, if a signal level rapidly changes to a high signal level after DPD parameters are estimated at a low signal level.

On the other hand, FIG. 19 illustrates the system output spectrum obtained when pre-distortion is performed through the proposed DPD apparatus under the above experimental conditions. Referring to FIG. 19, it can be noted that since DPD parameters are estimated based on signals in the full range, which are stored in a buffer for each interval corresponding to a signal level, the DPD apparatus may stably perform a DPD operation even if a signal level rapidly changes from the low signal level to the high signal level.

While the disclosure has been shown and described with reference to certain exemplary embodiments thereof, it will be understood by those skilled in the art that various changes in form and details may be made therein without departing from the spirit and scope of the disclosure as defined by the appended claims and their equivalents.

The invention claimed is:

1. A digital pre-distortion (DPD) apparatus for processing a signal that is input to a power amplifier in a wireless communication system, the DPD apparatus comprising:
   a DPD circuit configured to pre-distort an input signal that is input to the power amplifier, using DPD information; and
   a signal processor configured to:
      capture signals for an estimation of the DPD information from each of an input terminal and an output terminal of the power amplifier,
      detect peak signals of the captured signals,
      separate the detected peak signals into a plurality of intervals depending on a power level,
      separately store the detected peak signals for each interval of the plurality of intervals,
      estimate the DPD information using the detected peak signals stored for each interval, and
      provide the estimated DPD information to the DPD circuit.

2. The DPD apparatus of claim 1, wherein the signal processor includes at least one buffer configured to separately store the detected peak signals.

3. The DPD apparatus of claim 1, wherein the detected peak signals stored for each interval are updated for each interval.

4. The DPD apparatus of claim 1, wherein the signal processor is configured to estimate the DPD information by combining the detected peak signals stored for each interval.

5. The DPD apparatus of claim 1, wherein a number of the plurality of intervals is preset.

6. The DPD apparatus of claim 1, wherein a number of the plurality of intervals is variably set depending on a DPD operation status.

7. The DPD apparatus of claim 1, wherein the plurality of intervals are separated depending on the power level.

8. The DPD apparatus of claim 1, wherein the signal processor is configured to:
   determine whether the captured signals are valid, based on at least one of a signal quality of the captured signals or a signal level limit, and
   detect the peak signals of the signals determined to be valid among the captured signals, as the peak signals of the captured signals.

9. The DPD apparatus of claim 3, wherein if no peak signal is detected in some of the plurality of intervals, some of the detected peak signals of the captured signals, which were previously detected in a specific interval of the plurality of intervals, are reused in the some of the plurality of intervals in which no peak signal is detected.

10. A digital pre-distortion (DPD) method for processing a signal that is input to a power amplifier in a wireless communication system, the DPD method comprising:
   capturing signals for an estimation of DPD information from each of an input terminal and an output terminal of the power amplifier;
   detecting peak signals of the captured signals;
   separating the detected peak signals into a plurality of intervals depending on a power level;
   separately storing the detected peak signals for each interval of the plurality of intervals;
   estimating the DPD information using the detected peak signals stored for each interval; and
   pre-distorting an input signal that is input to the power amplifier using the estimated DPD information.

11. The DPD method of claim 10, wherein storing includes separately storing the detected peak signals in a plurality of buffers corresponding to the plurality of intervals.

12. The DPD method of claim 10, wherein storing includes updating the detected peak signals stored for each interval.

13. The DPD method of claim 10, wherein estimating includes estimating the DPD information by combining the detected peak signals stored for each interval.

14. The DPD method of claim 10, wherein a number of the plurality of intervals is preset.

15. The DPD method of claim 10, wherein a number of the plurality of intervals is variably set depending on a DPD operation status.

16. The DPD method of claim 10, wherein the plurality of intervals are separated depending on the power level.

17. The DPD method of claim 10, wherein detecting includes determining whether the captured signals are valid based on at least one of a signal quality of the captured signals or a signal level limit, and detecting the peak signals of the signals determined to be valid among the captured signals, as the peak signals of the captured signals.

18. The DPD method of claim 12, wherein if no peak signal is detected in some of the plurality of intervals, some of the detected peak signals of the captured peak signals, which were previously detected in a specific interval of the plurality of intervals, are reused in the some of the plurality of intervals in which no peak signal is detected.

* * * * *